United States Patent
Bronner et al.

(10) Patent No.: US 6,638,815 B1
(45) Date of Patent: Oct. 28, 2003

(54) FORMATION OF SELF-ALIGNED VERTICAL CONNECTOR

(75) Inventors: Gary Bela Bronner, Stormville, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/280,971

(22) Filed: Oct. 25, 2002

(51) Int. Cl.[7] ......................................... H01L 21/8242
(52) U.S. Cl. ...................... 438/246; 438/244; 438/243; 438/386; 438/387; 438/389; 438/392; 438/249; 257/301
(58) Field of Search ............................. 438/243–249, 438/386–392; 257/301

(56) References Cited

U.S. PATENT DOCUMENTS

| | | | |
|---|---|---|---|
| 6,040,213 A | * | 3/2000 | Canale et al. ............... 438/243 |
| 6,204,527 B1 | * | 3/2001 | Sudo et al. .................. 257/301 |
| 6,410,391 B1 | * | 6/2002 | Zelsacher .................... 438/259 |
| 6,440,793 B1 | * | 8/2002 | Divakaruni et al. ........ 438/243 |
| 2001/0038113 A1 | * | 11/2001 | Bronner et al. ............. 257/301 |
| 2002/0005538 A1 | * | 1/2002 | Luetzen et al. ............. 257/301 |
| 2003/0013259 A1 | * | 1/2003 | Chidambarrao et al. ..... 438/301 |
| 2003/0022457 A1 | * | 1/2003 | Gutsche et al. ............. 438/386 |

FOREIGN PATENT DOCUMENTS

JP  05067749 A  *  3/1993  ......... H01L/27/108

* cited by examiner

*Primary Examiner*—John F. Niebling
*Assistant Examiner*—Jennifer M. Kennedy
(74) *Attorney, Agent, or Firm*—Steven Capella

(57) ABSTRACT

In a vertical-transistor based semiconductor structure, the problem of making a reliable electrical connection between the node of the deep trench capacitor and the lower electrode of the vertical transistor is solved by; depositing a sacrificial insulator layer, forming a vertical hardmask on the inner trench walls above the sacrificial insulator, then stripping the insulator to expose the substrate walls; diffusing dopant into the substrate walls to form a self-aligned extension of the buried strap; depositing the final gate insulator; and then forming the upper portion of the vertical transistor.

19 Claims, 6 Drawing Sheets

FORMATION OF SELF-ALIGNED VERTICAL CONNECTOR

TECHNICAL FIELD

The field of the invention is that of forming three-dimensional structures in integrated circuit processing, in particular DRAM cells or other structures that use vertical transistors.

BACKGROUND OF THE INVENTION

Several novel DRAMs use cells with vertical transistors in order to reduce space by stacking the transistor generally above the capacitor and to avoid problems with scaling the pass transistor.

In addition, circuit configurations have been proposed that involve placing two or more vertical transistors above one another. In that case also, the current path from one transistor to another must extend transversely outside the trench and into the semiconductor substrate.

Since the trench capacitor center electrode (or a lower interconnect electrode) is located in the trench that also holds the transistor gate, the current path through the transistor body must extend transversely outside the trench and into the semiconductor substrate.

In the case of stacked capacitor cells with buried bitlines or in the case of buried wiring levels below vertical transistors, the current path must similarly extend transversely outside the trench carrying the buried bitline or wiring level.

Prior art methods of introducing dopants into the substrate have involved outdiffusing from a heavily doped layer of poly (the inner electrode) and heating the wafer to drive the dopant into the substrate. As dimensions shrink, the inevitable manufacturing process fluctuations result in a greater percentage variation in vertical height between the capacitor and the transistor. At the same time, reduction in ground rules requires closer lateral spacing between cells and prevents the use of an increased dopant outdiffusion to provide a reliable current path.

The process of etching the pad oxide produces a "divot" where the oxide is undercut. This can give rise to difficulties in later processing.

SUMMARY OF THE INVENTION

The invention relates to a method of making a three-dimensional electrical structure making contact between two circuit elements that are separated vertically and horizontally.

A feature of the invention is the diffusion of dopant from an aperture cut into a semiconductor substrate, thereby extending a conductive path laterally into the substrate.

Another feature of the invention is the opening of a diffusion window in the sidewall of a trench for entry of dopant to form a self-aligned conductive path.

Another feature of the invention is the use of a temporary layer to provide an offset for a hardmask formed on the interior of a trench.

Yet another feature of the invention is that the pad oxide is not attacked during the wet etch of the collar.

Yet another feature of the invention is that there is only one Trench Top Oxide (TTO) layer required.

Yet another feature of the invention is an additional recess step to expose the side of an oxide collar for a novel strap formation technique.

Yet another feature of the invention is the use of a temporary layer to define a diffusion window for diffusion of dopant into the substrate to form a self-aligned extension of the buried strap in a DRAM cell having a vertical transistor.

DETAILED DESCRIPTION

Figure 1:
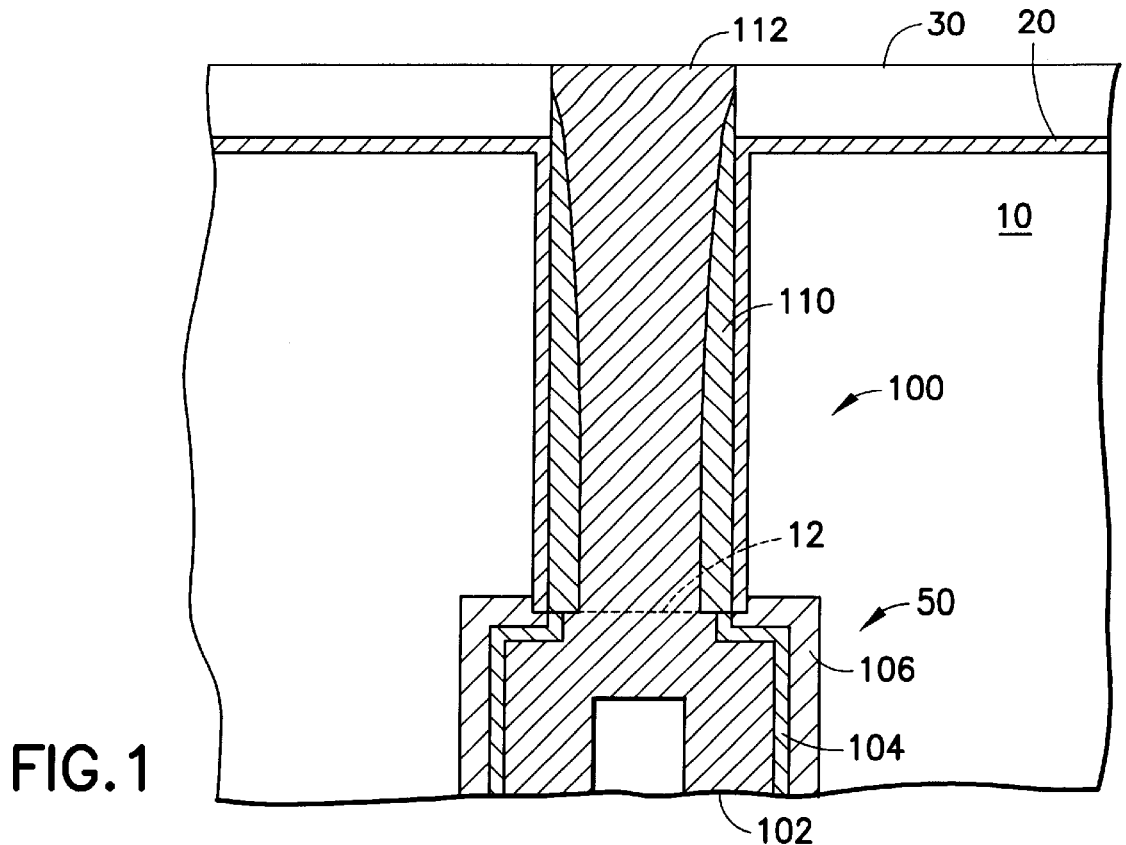
FIGS. 1 through 8 show in cross section a portion of a DRAM cell constructed according to the invention.

FIG. 1 shows in cross section a portion of a semiconductor substrate 10 that will hold a DRAM cell, denoted generally by numeral 100, to be formed in a p-type semiconductor substrate 10, which may be silicon, SiGe, GaAs or other semiconductor. Pad oxide 20 and pad nitride 30 protect the top surface. A bulk substrate is shown for convenience, but the invention may also be practiced with layered substrates, such as silicon on insulator. A deep trench having sidewalls and a vertical aperture axis has been etched into substrate 10, e.g. to a depth of about 5 μm to 10 μm and a capacitor 50 has been formed in the trench, according to standard practice.

Polysilicon center electrode 112 is one electrode of the capacitor, buried plate 10 in the substrate being the other. Dielectric 104 is the capacitor dielectric. A conventional buried plate 106 has been formed by diffusing dopant into substrate 10, as is known in the art. Illustratively, electrode 112, referred to as a lower electrode, is formed from polycrystalline silicon (poly) or amorphous silicon, doped $N^+$ and dielectric 104 is an nitride-oxide (NO)(oxide being $SiO_2$ and nitride being $Si_3N_4$) layer. Collar oxide 110 has been deposited on the upper portion of the trench sidewalls. Dotted line 12 marks the boundary between the bottom of the collar and the top of the capacitor structure.

Capacitor 50 will be isolated from the structure to be built above it by a dielectric layer placed in the trench. An electrical path is required between the capacitor electrode and the next structure. This path, referred to as a buried strap, will pass horizontally into substrate 10 and then vertically through the substrate to the next structure.

Figure 2:
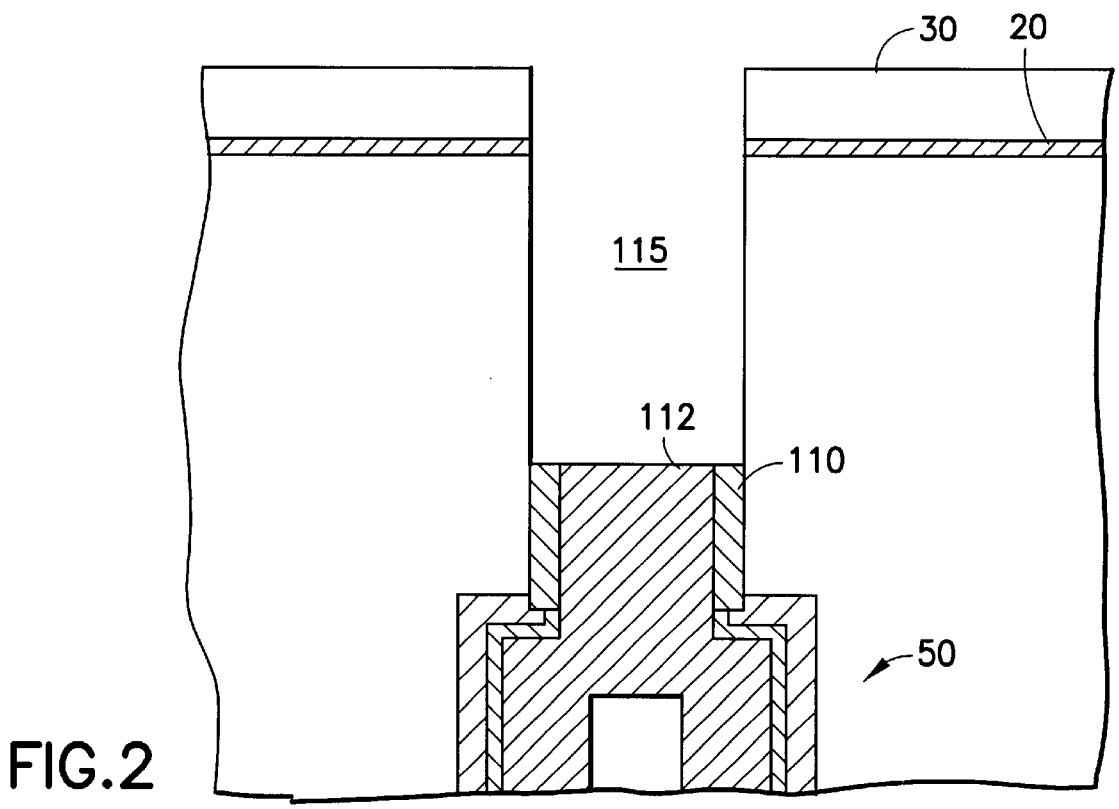

Referring now to FIG. 2, poly 112 has been recessed in a conventional reactive ion dry etch to a reference depth at a nominal depth of 350 nm, leaving aperture 115 and exposed sidewalls of substrate 10. Collar oxide 110 on the sidewalls has been etched by a HF based wet etch to the same depth. The dielectric layer referenced in the preceding paragraph will be placed on the top surface of poly 112.

Figure 3:
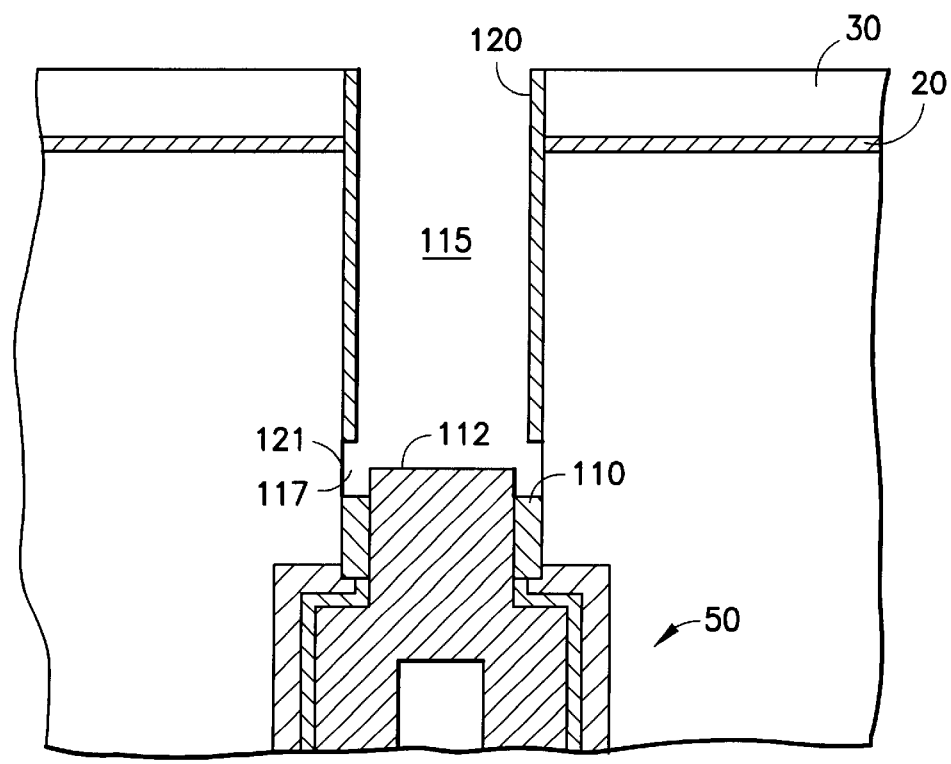

Next, as shown in FIG. 3, the pad nitride is pulled back by a HF-EG (HF-Ethylene Glycol) chemistry based wet etch. A nitride ($Si_3N_4$) spacer 120 has been deposited on the sidewalls and pad oxide 20. Poly 112 is then recessed an additional 50 nm or so, exposing a vertical surface of remaining oxide 110; and collar oxide 110 has been recessed further, leaving small apertures 117 on either side of a projecting portion of poly 112. The top surface of poly 112 before this recess step serves as a reference for nitride spacer 120. The exposed portion of the substrate sidewalls 121 in aperture 117 will be treated to provide a vertical conducting path through substrate 10. The spacer 120 protects the pad oxide 20 during the wet etch of collar 110. This allows a deep strap to be formed independent of pad oxide attack. The pad oxide is protected by the nitride spacer 120. Attack of the pad oxide is undesirable for subsequent processing steps.

Figure 4:
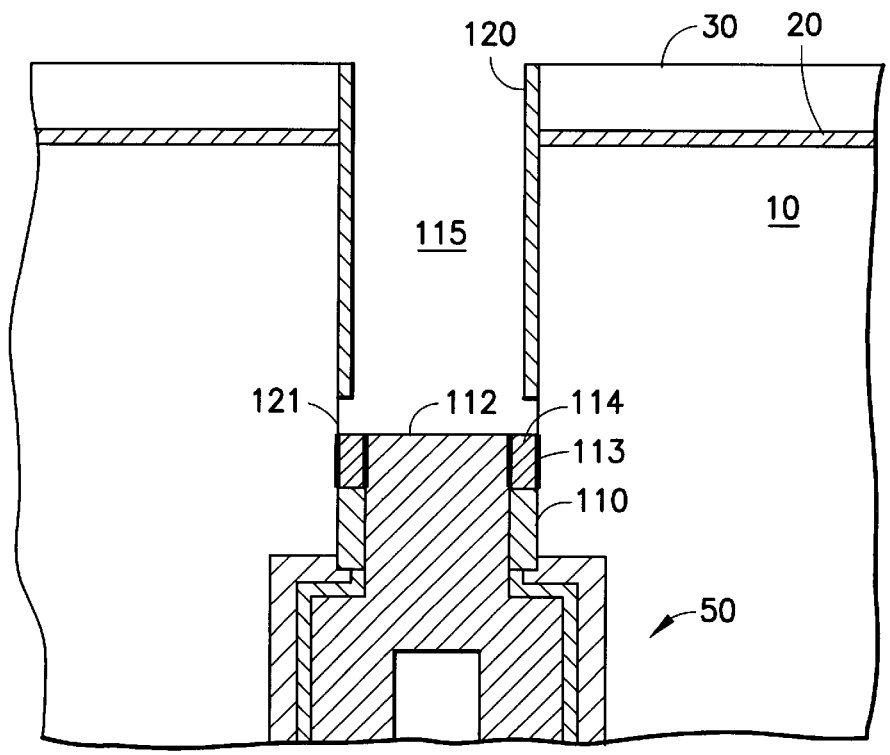

Next, as shown in FIG. 4, a poly deposition has filled apertures 117 with poly to make strap 114. The deposition step was preceded by depositing an optional thin (nominally 5 nm) layer of nitride 113 to reduce possible leakage to substrate 10. A step of BSPE (meaning buried strap polysilicon etch back) has produced a planar top surface on poly 112, leaving a vertical strip 121 of the sidewall exposed. The BSPE process basically consists of a thin (15–30 nm) polysilicon deposition and etch to fill the void formed by the collar etch.

Figure 5:
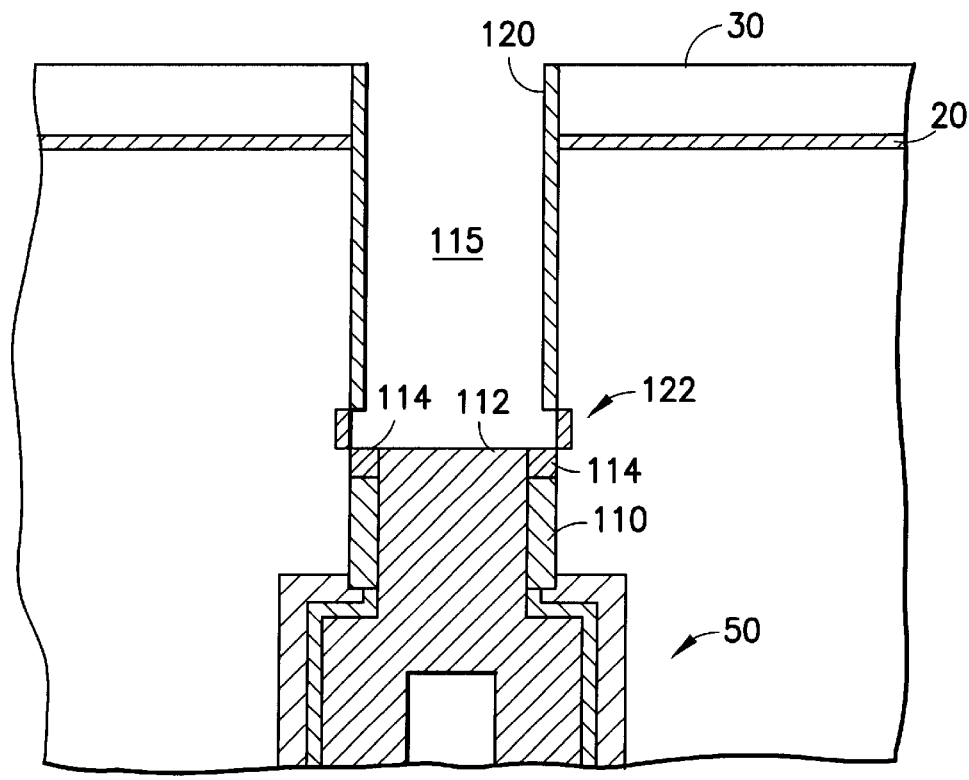

Referring to FIG. 5, the same area is shown after a doping step using As or P as the dopant species. A speckled area 122 indicates where dopant has diffused into the substrate. Preferably, a Gas Phase Diffusion process is used. The nominal depth of penetration of the dopant is 10 nm. Another process in which a doped layer of polysilicon or doped glass is deposited and the wafer is heated, driving the dopant into the substrate could be used, but the gas process is preferred because it is cheaper.

As or P is used to dope the source/drain of the vertical transistor if it is an NFET, as is typically done in a DRAM cell. The invention could also be practiced with e PFET, with the appropriate change in the dopant (e.g. an acceptor type such as Boron).

Figure 6:
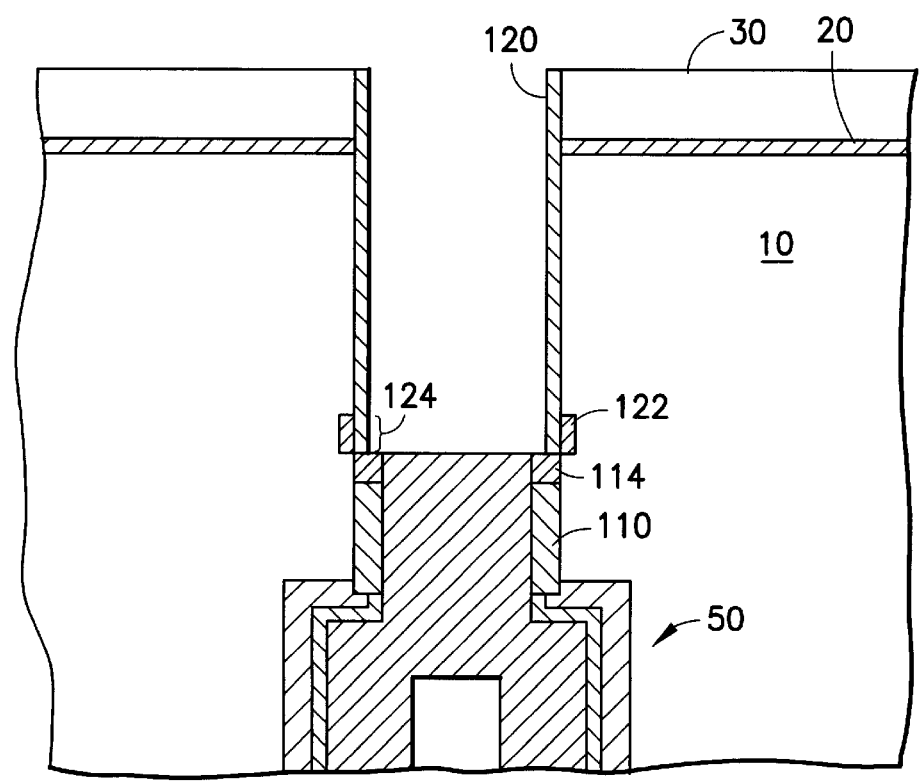

The function of doped area 122 is to provide a self-aligned link between the buried strap and a transistor body 145 that will be formed in substrate 10 at the top of the Figure. After the formation of area 122, the exposed portion of the sidewall is covered by a layer of thermal oxide, nominally 10 nm thick, denoted by bracket 124 in FIG. 6. This oxide is thicker than the subsequent gate oxide and is grown such that it is flush with the bottom of the nitride spacer. As is expected, a bird's beak of oxide will form under the nitride spacer.

Figure 7:
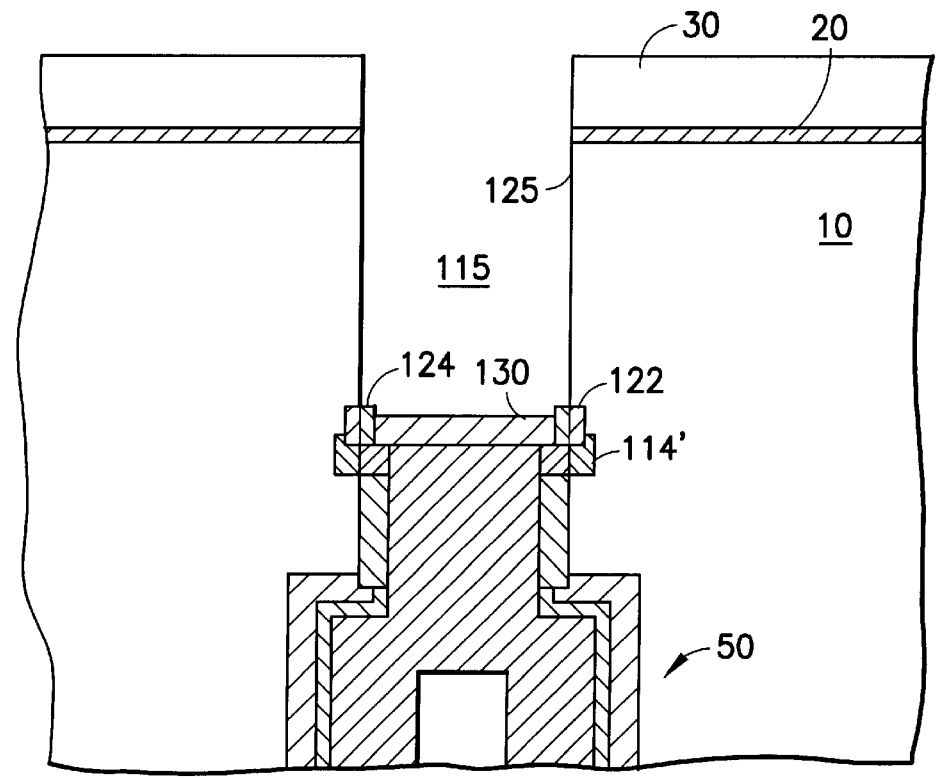

Self alignment is an advantageous feature of the invention, since the transistor gate is defined by the top edge of dopant 122 in FIG. 7 below. The definition of the transistor body at that height results because the gate oxide is grown in the space vacated by spacer 120 and the transistor gate is conformally grown in the space vacated under spacer 120 so that the lower edge of the transistor body is self-aligned with the top of the diffusion window. Thus, the dopant diffused in through space 121 forms a doped area that provides a current path between the buried strap and the transistor body. The area 122 can be referred to as the lower transistor electrode, since it is adjacent to the transistor body on the lower side. Those skilled in the art will be aware that the dopant will diffuse vertically as well as horizontally, so that there will be a small vertical extension past the edge of the window 121. Since there is no external contact made to this area, which is internal to the cell, it makes no difference if a line is drawn between the lower electrode and the conductive path to the buried strap—they merge.

The result is that the inventive process provides a reliable connection between center electrode 205 and the vertical transistor, which may be part of DRAM cell 100.

Figure 8:
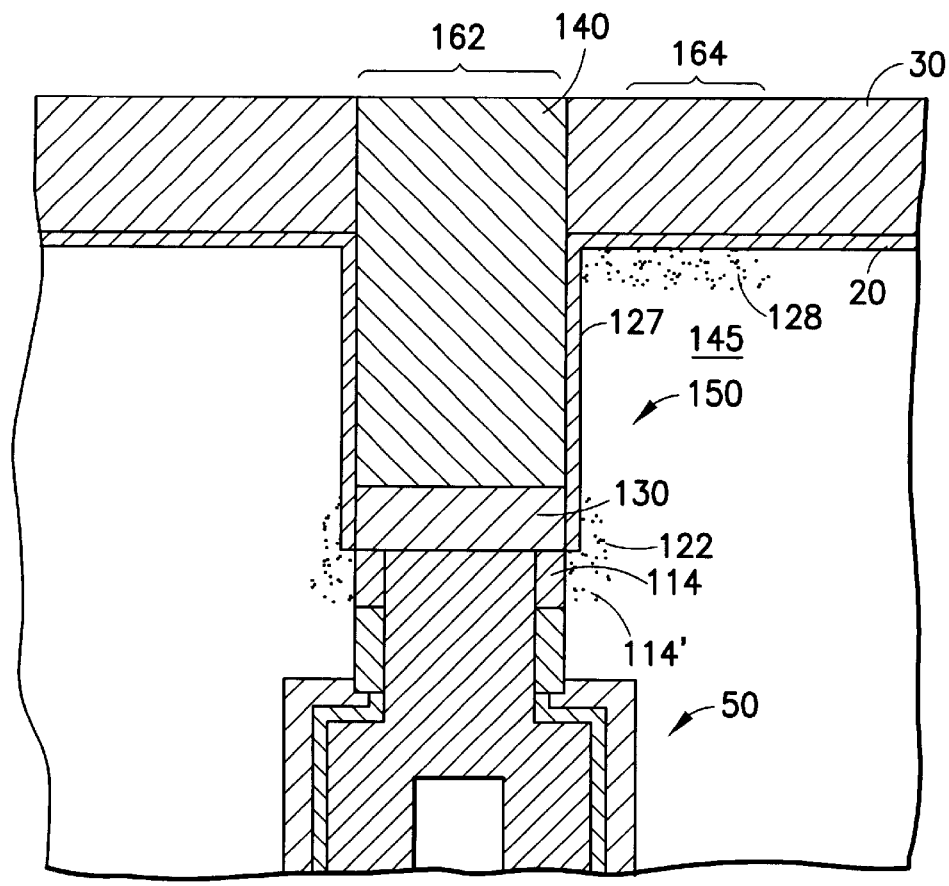

After the diffusion step, a final insulating layer, generally referred to as Trench Top Oxide 130, is deposited between the self-aligned layers of thermal oxide 124 and the nitride hardmask 120 is subsequently stripped. The high-temperature step of growing oxide 124 has diffused dopant out from poly 114 into the substrate, shown as area 114'. The result is shown in FIG. 8. Note that the TTO thickness is anywhere from 10 nm–50 nm determined by the reliability requirements of the structure. This invention allows the TTO thickness to be independent of the original opening 120 and determined only by reliability considerations.

A layer of thermal gate oxide 127, 4–7 nm thick, is grown on the sidewalls of the trench in preparation for completing a vertical transistor. The dopant 122 diffused through space 121 functions as the lower electrode of the transistor. The transistor body starts at the upper edge of electrode 122, nominally at the top edge of the portion of oxide 124 in contact with the silicon. The function of layer 130 is to provide isolation between the transistor gate that will be formed in the top portion of aperture 115 and buried strap 114.

FIG. 8 shows a completed cell, in which transistor 150 has gate 140 formed in the upper portion of the trench, upper electrode 128 and lower electrode 124 are on opposite sides of body 145, the body being separated from the gate by insulator 127. Poly 140 has been deposited to fill the aperture and planarized with respect to pad layers 30. Brackets 162 and 164 indicate places where contacts will be formed in later steps for a gate (wordline) contact and a bitline contact, respectively. A conductive path denoted with numerals 122 and 114' permits passage of electrons through buried strap 114 in and out of center electrode 112. Illustratively, the cell illustrated is part of a DRAM array that is connected to other portions of a circuit. There will be support circuitry (input/output, charge pumps, redundant portions, etc.) and/or logic portions in the case of an embedded DRAM array incorporated in a logic circuit. Such conventional portions are omitted from the figures for simplicity.

Figure 9:
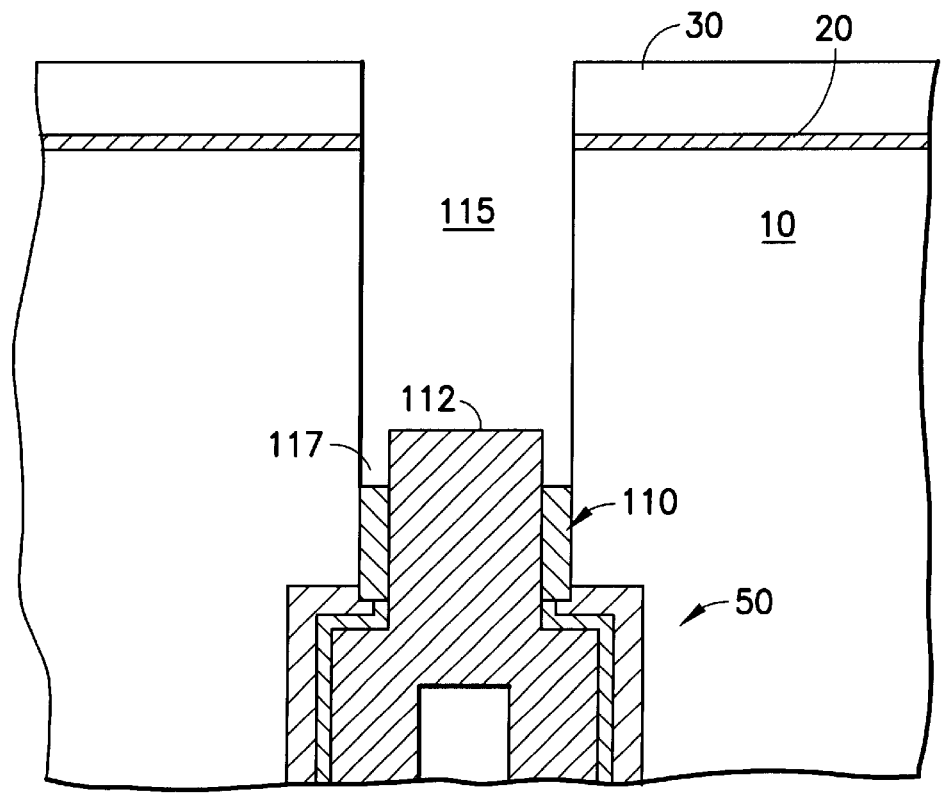
FIGS. 9 through 12 show in cross section a corresponding portion of an alternative embodiment of the invention.

Referring now to FIG. 9, there is shown a cross section of an alternate embodiment of the invention, starting after FIG. 1. In this embodiment, poly 112 is recessed and an oxide etch removes collar oxide down to the level of the poly and continues to form apertures 117 and remove collar oxide members 110 earlier in the sequence than in the first embodiment.

Figure 10:
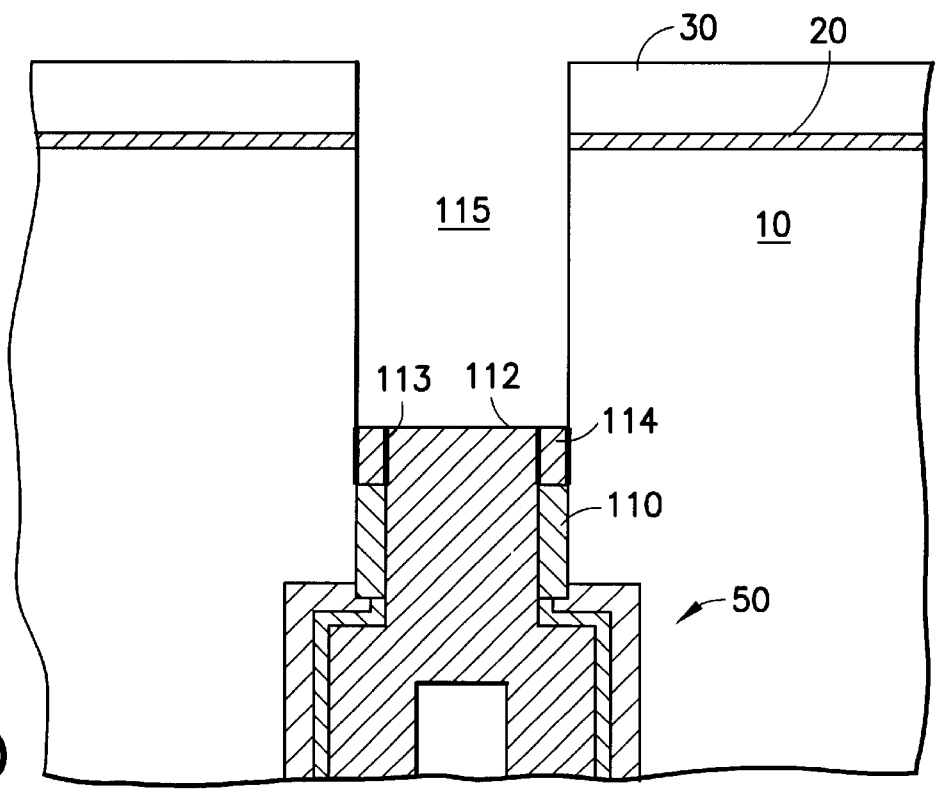

Next, poly is deposited in recesses 117 to form strap 114 (with the same thin nitride layer 113), as shown in FIG. 10.

Figure 11:
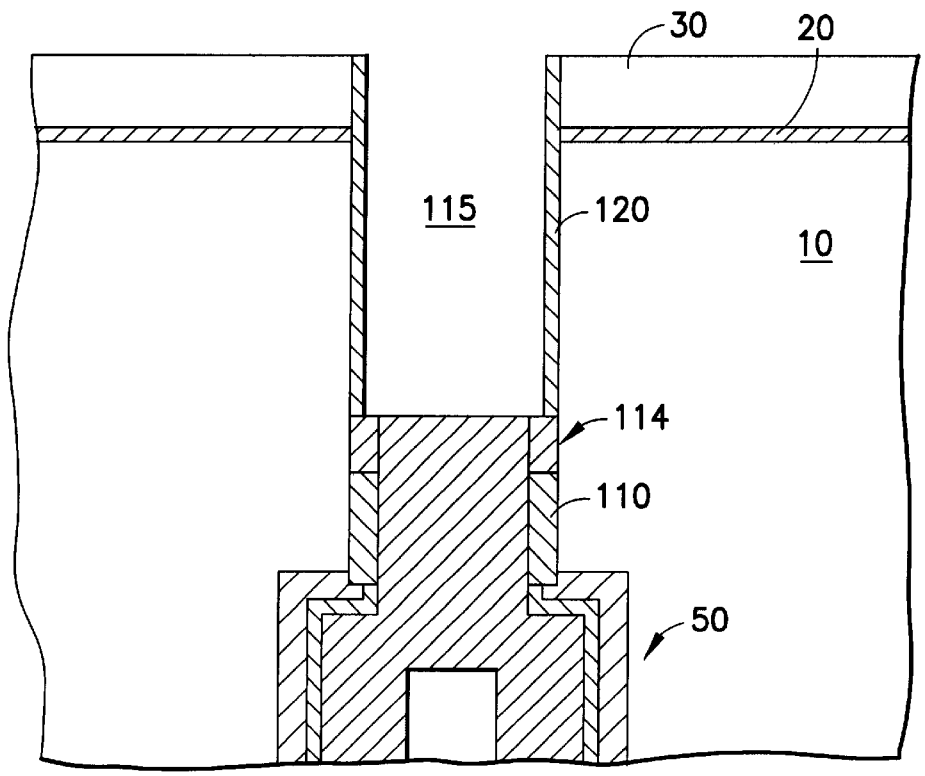
Figure 12:
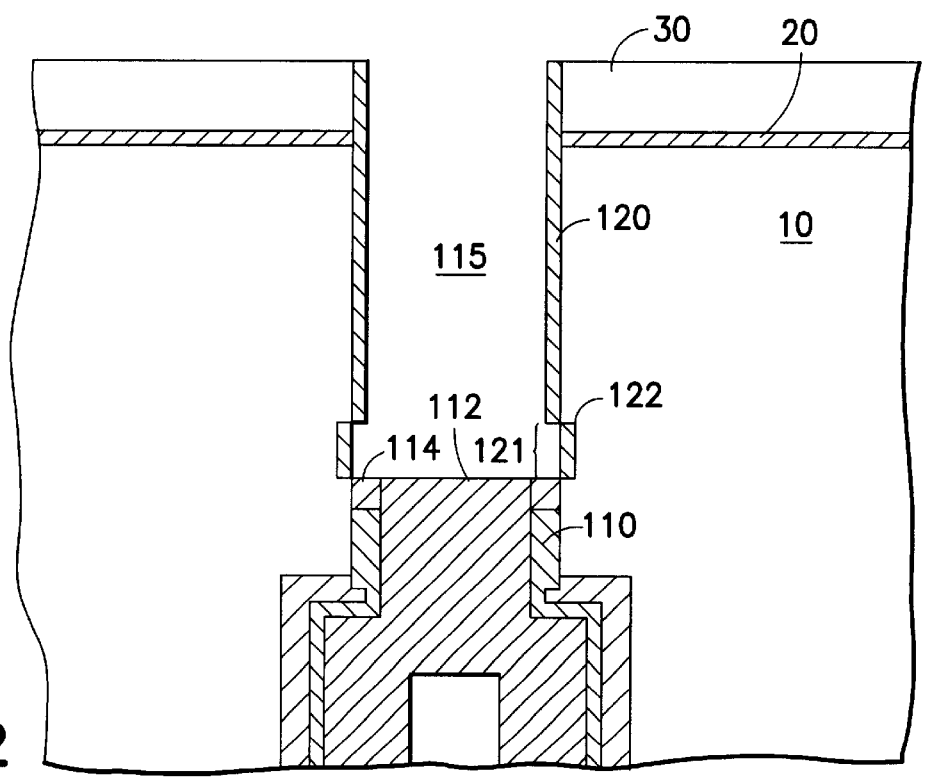

The result of a pad oxide deposition and a nitride 120 deposition is shown in FIG. 11, after which a second poly recess (less than the original collar wet etch opening 117) opens a window 121 along the sidewall, through which the doping is performed with the same gas phase doping as before. The structure shown in FIG. 12 is the same as that shown in FIG. 5. Processing continues with thermal oxidation of the silicon in window 121 and the following steps as before. Note that in this second embodiment, the final strap opening is reduced by the second polysilicon recess after the nitride spacer 120 is formed. Also note that in the second embodiment, the pad oxide undercut is not prevented during the massive oxide overetch to form a deep strap opening 117. Thus, this embodiment is practiced when a nitride divot fill has been performed before the collar is formed to protect the pad oxide from a massive undercut. A nitride divot fill is formed by intentionally etching the pad oxide after the deep trench silicon etch or before the collar oxide 110 is deposited. The undercut in the pad oxide is then filled with SiN by depositing nitride and etching the same amount so the "divot" in pad oxide is now filled in with nitride and resists subsequent oxide etches.

The second embodiment is preferably formed such that the steps are the same as the first embodiment until after FIG. 2. Then the trench is filled with poly after nitride and recessed above the first recess. This then forms a structure similar to FIG. 10 except that strap 113 is continuous along the location of the first recess. The spacers are then formed as in FIG. 11. This method avoids the disadvantage of having to form a deep opening 117. The first recess is deeper by about 100 nm than the second recess.

This embodiment of the invention can be summarized in the following table:
Step
(1) Form the trench
(2) Form the capacitor
(3) Recess the poly and form the oxide collar
(4) Recess the poly again and wet etch the oxide collar
(5) Fill the poly and perform a second recess to a depth above the first recess
(6) Form the nitride spacer
(7) Recess the poly and perform the gas phase doping
(8) Continue with the process to form the isolation between the vertical transistors, form the transistors themselves and the rest of the circuit.

A divot fill step according to the invention can be inserted in several places in this sequence. In a first version, the divot fill step can be performed after trench formation step (1). In a second version, the divot fill step can be performed after step (3). In a third version, the divot fill step can be performed after step (4).

Those skilled in the art will appreciate that the inventive method may be used for connections in other circuits than DRAMs. Many suggestions have been made in the art for three-dimensional stacking of transistors and other devices, which may benefit for the ability to make a connection through the substrate or other dielectric material from a lower electrode to an upper one that is displaced horizontally outside whatever structure holds the lower electrode; e.g. capacitor 50 may be replaced with another transistor connected through the path 122–114'.

While the invention has been described in terms of a single preferred embodiment, those skilled in the art will recognize that the invention can be practiced in various versions within the spirit and scope of the following claims.

What is claimed is:

1. A method of making an electrical connection between a lower electrical contact and a contact region of a semiconductor substrate comprising the steps of:

forming said lower electrical contact having a contact top surface at a reference depth in an aperture formed in a semiconductor substrate and having aperture sidewalls;

forming a first sidewall layer overlapping said lower electrical contact along a vertical axis;

forming a vertical hardmask on said aperture sidewalls above said reference depth;

recessing an upper portion of said lower electrical contact to a second depth below said reference depth;

recessing an upper portion of said sidewall layer adjacent to said lower electrical contact below said reference depth, thereby exposing said aperture sidewalls below said vertical hardmask in a diffusion window;

depositing supplementary conductive material in said diffusion window to the level of said second depth, thereby establishing said diffusion window between said second depth and said vertical hardmask; and diffusing dopant into the substrate walls through said diffusion window, thereby forming a conductive path vertically through said substrate from said lower electrode to said contact region of said substrate.

2. A method according to claim 1, further comprising the step of forming said lower electrical contact by depositing sidewalls in said aperture and filling said aperture between said sidewalls with conductive material and recessing said conductive material to said reference depth to form said lower electrical contact.

3. A method according to claim 1, further comprising the step of diffusing dopant from said supplementary conductive material in said diffusion window into said substrate, thereby establishing an electrical path from said lower electrode through said supplementary conductive material into said substrate.

4. A method according to claim 2, further comprising the step of diffusing dopant from said supplementary conductive material in said diffusion window into said substrate, thereby establishing an electrical path from said lower electrode through said supplementary conductive material into said substrate and then vertically to said contact region of said substrate.

5. A method according to claim 1, further comprising the step of stripping said vertical hardmask on the inner trench walls forming the transistor gate insulator on said inner trench walls and then forming the upper portion of a DRAM cell.

6. A method according to claim 5, in which said contact region of said substrate is an electrode of a vertical transistor that is the pass transistor of a DRAM cell, said lower electrical contact is the capacitor contact of said DRAM cell and said vertical transistor body is formed adjacent to said aperture sidewalls, whereby dopant diffused through said diffusion window forms a self-aligned conductive path between said lower electrode and said electrode of a vertical transistor.

7. A method according to claim 1, in which said contact region of said substrate is an electrode of a first transistor and said lower electrical contact is an electrode of a second transistor, whereby dopant diffused through said diffusion window forms a self-aligned conductive path between said first and second transistors.

8. A method of making an electrical connection between a lower electrical contact and a contact region of a semiconductor substrate having a pad oxide layer, comprising the steps of:

a) forming an aperture having aperture sidewalls in said substrate;

b) forming said lower electrical contact having a contact top surface at a reference depth in said aperture;

c) forming a first sidewall layer on said aperture sidewalls overlapping said lower electrical contact along a vertical axis;

d) recessing an upper portion of said lower electrical contact and said sidewall layer adjacent to said lower electrical contact below said reference depth, thereby exposing said aperture sidewalls below said reference depth;

e) depositing conductive material adjacent to said exposed aperture sidewalls to the level of said reference depth;

f) forming a vertical hardmask on the aperture sidewalls above said reference depth;

g) recessing an upper portion of said lower electrical contact to a second depth below said reference depth, thereby establishing a diffusion window between said reference depth and said vertical hardmask;

h) diffusing dopant into the substrate walls through said diffusion window, thereby forming a conductive path vertically from said lower electrode to said contact region of a semiconductor substrate: and performing a divot replacement step further comprising filling an undercut below said pad oxide with nitride.

9. A method according to claim 8, in which said step of divot replacement is performed after said step of forming said aperture.

10. A method according to claim 8, in which said step of divot replacement is performed after said step b) of forming said contact and before said step c) of forming said sidewalls.

11. A method according to claim 8, in which said step of divot replacement is performed after said step d) of recessing an upper portion of said electrical contact and said sidewall layer and before said step f) of forming a vertical hardmask.

12. A method according to claim 8, further comprising the step of stripping said vertical hardmask on the inner trench walls forming the transistor gate insulator on said inner trench walls and then forming the upper portion of a DRAM cell.

13. A method according to claim 9, further comprising the step of stripping said vertical hardmask on the inner trench walls forming the transistor gate insulator on said inner trench walls and then forming the upper portion of a DRAM cell.

14. A method according to claim 10, further comprising the step of stripping said vertical hardmask on the inner trench walls forming the transistor gate insulator on said inner trench walls and then forming the upper portion of a DRAM cell.

15. A method according to claim 11, further comprising the step of stripping said vertical hardmask on the inner trench walls forming the transistor gate insulator on said inner trench walls and then forming the upper portion of a DRAM cell.

16. A method according to claim 12, in which said contact region of said substrate is an electrode of a vertical transistor that is the pass transistor of a DRAM cell, said lower electrical contact is the capacitor contact of said DRAM cell and said vertical transistor body is formed adjacent to said vertical hardmask, whereby dopant diffused through said diffusion window forms a self-aligned conductive path between said lower electrode and said electrode of a vertical transistor.

17. A method according to claim 13, in which said contact region of said substrate is an electrode of a vertical transistor that is the pass transistor of a DRAM cell, said lower electrical contact is the capacitor contact of said DRAM cell and said vertical transistor body is formed adjacent to said vertical hardmask, whereby dopant diffused through said diffusion window forms a self-aligned conductive path between said lower electrode and said electrode of a vertical transistor.

18. A method according to claim 14, in which said contact region of said substrate is an electrode of a vertical transistor that is the pass transistor of a DRAM cell, said lower electrical contact is the capacitor contact of said DRAM cell and said vertical transistor body is formed adjacent to said vertical hardmask, whereby dopant diffused through said diffusion window forms a self-aligned conductive path between said lower electrode and said electrode of a vertical transistor.

19. A method according to claim 15, in which said contact region of said substrate is an electrode of a vertical transistor that is the pass transistor of a DRAM cell, said lower electrical contact is the capacitor contact of said DRAM cell and said vertical transistor body is formed adjacent to said vertical hardmask, whereby dopant diffused through said diffusion window forms a self-aligned conductive path between said lower electrode and said electrode of a vertical transistor.

* * * * *